United States Patent
Coffy et al.

(10) Patent No.: US 11,322,666 B2
(45) Date of Patent: May 3, 2022

(54) OPTOELECTRONIC DEVICE

(71) Applicant: STMicroelectronics (Grenoble 2) SAS, Grenoble (FR)

(72) Inventors: Romain Coffy, Voiron (FR); Remi Brechignac, Grenoble (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 9 days.

(21) Appl. No.: 17/071,603

(22) Filed: Oct. 15, 2020

(65) Prior Publication Data

US 2021/0135069 A1    May 6, 2021

(30) Foreign Application Priority Data

Oct. 30, 2019   (FR) ...................................... 1912220

(51) Int. Cl.
*H01L 33/54* (2010.01)
*H01L 33/00* (2010.01)

(52) U.S. Cl.
CPC .......... *H01L 33/54* (2013.01); *H01L 33/0093* (2020.05)

(58) Field of Classification Search
None
See application file for complete search history.

(56) References Cited

U.S. PATENT DOCUMENTS

| | | | |
|---|---|---|---|
| 2011/0298004 A1* | 12/2011 | Matsuda | H01L 33/50 257/100 |
| 2014/0021491 A1 | 1/2014 | Meng et al. | |
| 2017/0038459 A1 | 2/2017 | Kubacki et al. | |
| 2019/0187254 A1 | 6/2019 | Kappel et al. | |
| 2020/0333442 A1 | 10/2020 | Etschmaier et al. | |
| 2021/0165085 A1 | 6/2021 | Downing et al. | |
| 2021/0373132 A1 | 12/2021 | Etschmaier et al. | |

FOREIGN PATENT DOCUMENTS

| | | |
|---|---|---|
| CN | 105977248 B | 3/2019 |
| EP | 2363726 A1 | 9/2011 |
| EP | 3471152 A1 | 4/2019 |
| JP | H05175545 A | 7/1993 |
| TW | 201725747 A | 7/2017 |
| WO | 2017142487 A1 | 8/2017 |

OTHER PUBLICATIONS

INPI Search Report and Written Opinion for FR 1912220 dated Jul. 9, 2020 (21 pages).

* cited by examiner

*Primary Examiner* — Robert K Carpenter
(74) *Attorney, Agent, or Firm* — Crowe & Dunlevy

(57) ABSTRACT

An optoelectronic device includes an emitter of light rays and a receiver of light rays. The emitter is encapsulated within a first encapsulation layer, and the receiver is encapsulated within a second encapsulation layer. An opaque layer covers the first encapsulation layer (encapsulating the receiver) and covers the second encapsulation layer (encapsulating the emitter). The first and second encapsulation layers are separated by a region of opaque material. This opaque material may be provided by the opaque layer or an opaque fill.

27 Claims, 4 Drawing Sheets

OPTOELECTRONIC DEVICE

PRIORITY CLAIM

This application claims the priority benefit of French Application for Patent No. 1912220, filed on Oct. 30, 2019, the content of which is hereby incorporated by reference in its entirety to the maximum extent allowable by law.

TECHNICAL FIELD

The present disclosure relates generally to optoelectronic devices and, more particularly, to devices comprising an emitter and a receiver of light rays.

BACKGROUND

Many electronic devices comprise a light ray emitter and a receiver configured to receive the rays emitted by the emitter. These, for example, are time-of-flight (TOF) sensors or optical switches.

A time-of-flight sensor enables to measure a distance between the sensor and an element of a scene. For this purpose, the time-of-flight sensor illuminates the scene with a light ray, and calculates the time taken by the ray to travel between the element and the sensor. The time of flight of this ray is directly proportional to the distance between the sensor and the object of the scene having its distance to the sensor measured.

An optical switch, for example, switches from one state to another when the distance between the switch and an object of the scene is shorter than a certain distance.

There is a need in the art to address all or some of the drawbacks of known optoelectronic devices.

SUMMARY

One embodiment provides an optoelectronic device comprising: an emitter and a receiver of light rays; and at least one first layer, opaque to the wavelengths of the light rays capable of being emitted by the emitter, covering the receiver and the emitter, the receiver and the emitter being separated by a region of a material opaque to the wavelengths of the light rays capable of being emitted by the emitter.

According to an embodiment, the region of opaque material is a portion of the first layer.

According to an embodiment, the receiver and the emitter are each covered with a second layer made of a material at least partially transparent to the wavelengths of the light rays capable of being emitted by the emitter, one of the second layers being located between the emitter and the first layer and the other one of the second layers being located between the receiver and the first layer.

According to an embodiment, the first layer comprises an opening facing the receiver and an opening facing the emitter.

According to an embodiment, a filter is located on each second layer, the openings being located opposite a filter.

According to an embodiment, a filter is located in each opening.

According to an embodiment, the region of opaque material fills the space between the second layers.

According to an embodiment, the receiver is configured to receive at least part of the rays capable of being emitted by the emitter.

Another embodiment provides a method of manufacturing an optoelectronic device comprising: forming on a support an emitter, and a receiver, of light rays; and forming a first layer, opaque to the wavelengths of the light rays capable of being emitted by the emitter, covering the receiver and the emitter, the emitter and the receiver being separated by a region of a material opaque to the wavelengths of the light rays capable of being emitted by the emitter.

According to an embodiment, the method comprises forming second layers made of a material at least partially transparent to the wavelengths of the light rays capable of being emitted by the emitter separated from each other, one of the second layers covering the emitter and the other second layer covering the receiver.

According to an embodiment, the method comprises filling the space between the second layers with an opaque material.

According to an embodiment, the method comprises forming the first layer, maintained substantially planar above the second layers.

According to an embodiment, the method comprises pressing a mold on the first layer so that the first layer uniformly covers the second layers.

According to an embodiment, the first layer is stretchable.

According to an embodiment, the first layer is formed by sputtering.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the possible applications of the device are not detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
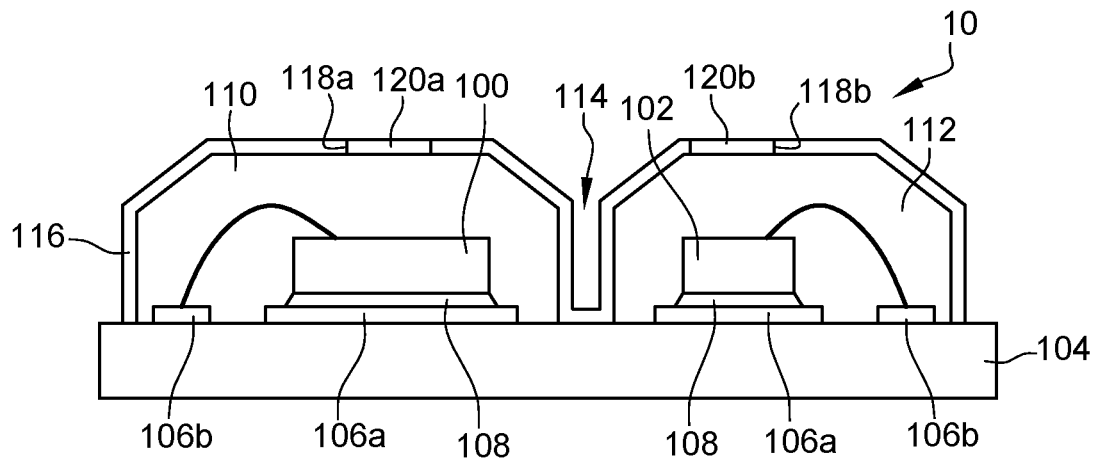
FIG. 1 shows an embodiment of an optoelectronic device.

FIG. 1 shows an embodiment of an optoelectronic device 10.

Device 10 is, for example, a time-of-flight sensor or an optical switch. Device 10 comprises an emitter 100 of light rays and a receiver 102 of light rays. The rays emitted by emitter 100 are, for example, infrared rays (rays having, for example, a wavelength greater than 700 nm). Receiver 102 is configured to receive at least part of the rays emitted by emitter 100 (for example, the part which is reflected and returned back to the device.

For example, receiver 102 and emitter 100 comprise a circuit, not shown, or are coupled to a circuit, not shown, configured to determine the distance of an element of a scene based on the time between the emission of the rays by emitter 100 and the reception of the reflected or returned part by receiver 102.

Device 10 comprises a support 104, for example, at least partially made of an electrically-insulating material. Emitter 100 and receiver 102 are located on support 104. Emitter 100 and receiver 102 are bonded to support 104.

In the embodiment of FIG. 1, conductive pads 106, for example, metal pads, are located on the upper surface of the support 104.

Pads 106 are, for example, coupled together and/or to other electronic components, for example, by means of conductive vias (not shown) and metallization levels (not shown) located in support 104. Pads 106 are, for example, coupled together and/or to other electronic components, for example, by means of conductive tracks located on the upper surface of support 104.

Receiver 102 and emitter 100 are, in the example of FIG. 1, each located on a conductive pad 106 designated in FIG. 1 with reference 106a. For example, emitter 100 and receiver 102 are each bonded to a conductive pad 106a by a bonding layer 108, for example, a glue layer. Preferably, bonding layer 108 is a conductive layer.

Emitter 100 and receiver 102 are, for example, coupled to one or a plurality of other conductive pads 106b, for example, by a wire connection, for example, by electric (bonding) wires.

A layer 110 covers (for example, encapsulates) emitter 100. Layer 110 is made of a material at least partially transparent to the wavelengths of the rays capable of being emitted by emitter 100. Layer 110 is preferably made of an electrically-insulating material. The term material transparent to a wavelength designates a material passing at least 90% of the rays having this wavelength.

A layer 112 covers (for example, encapsulates) receiver 102. Layer 112 is, like layer 110, made of a material at least partially transparent to the wavelengths of the rays capable of being emitted by emitter 100. Layer 112 is preferably made of an electrically-insulating material. For example, layers 110 and 112 are made of a resin.

Layer 110 and layer 112 respectively cover, for example, emitter 100 and receiver 102, the conductive pads 106a to which the emitter 100 and receiver 102 are bonded, and the conductive pads 106b to which the emitter 100 and receiver 102 are electrically connected by wires.

Layers 110 and 112 are separate. Layer 110, covering emitter 100, is distinct from layer 112, covering receiver 102. There thus is a space 114 between layers 110 and 112. Layers 110 and 112 are, for example, separated by a distance greater than or equal to approximately 200 µm.

Each layer 110 or 112, for example, has the shape of a tapered parallelepiped. More precisely, each layer 110 or 112, for example, comprises a substantially horizontal upper surface and substantially vertical lateral surfaces, the lateral surfaces and the upper surface being coupled by inclined surfaces.

Preferably, the external angles between the upper surface and the inclined surfaces and between the inclined surfaces and the lateral surfaces are smaller than 90°, preferably, between 20° and 70°.

As a variation, layers 110 and 112 may have a different shape. Preferably, layers 110 and 112 only comprise external angles between their different (adjacent, connected) surfaces smaller than 90°.

As a variation, the angles between the upper surface and the inclined surfaces and between the inclined surfaces and the lateral surfaces are rounded.

Preferably, the upper surfaces of layers 110 and 112 are substantially coplanar.

Layers 110 and 112 are covered with a layer 116. Layer 116 extends on the lateral, upper, and inclined surfaces of layers 110 and 112. Preferably, layer 116 also covers the upper surface of support 104 in space 114, between layers 110 and 112.

Layer 116 is made of a material opaque at least to the wavelengths of the rays capable of being emitted by emitter 100. The term material opaque to a wavelength means a material passing less than 0.001% of the rays having this wavelength.

Layer 116 is, for example, made of a material based on poly(ethylene-co-tetrafluoroethylene). Layer 116, for example, has a thickness greater than or equal to 50 µm, preferably greater than or equal to 100 µm. The color of layer 116 is selected to ensure the opacity of layer 116 to the wavelengths of the rays capable of being emitted by emitter 100.

The thickness of layer 116 is, for example, sufficiently small to avoid filling space 114 between layers 110 and 112.

Layer 116 comprises two openings 118. Layer 116 comprises an opening 118a facing emitter 100 and an opening 118b facing receiver 102. The positions and the dimensions of openings 118 are such that the light rays emitted by emitter 100 may cross opening 118a and may reach the receiver via opening 118b.

Preferably, layers 110 and 112 are totally covered with layer 116, except for openings 118.

Preferably, openings 118 each comprise a filter 120. Opening 118a comprises a filter 120a and opening 118b comprises a filter 120b. Each of filters 120 preferably extends in the entire corresponding opening 118. Preferably, each filter 118 totally fills the opening where it is located.

Filters 120 are, for example, made of a material at least partially transparent to the wavelengths of the rays capable of being emitted by emitter 100.

Filters 120, for example, have a thickness in the range from 2 to 8 µm, preferably equal to approximately 5 µm. The horizontal dimensions of the filters are, for example, in the range from approximately 250 µm to 500 µm. For example, the horizontal dimensions of filter 120a are equal to approximately 400 µm and the horizontal dimensions of filter 120b are equal to approximately 300 µm.

As a variation, the thickness of layer 116 and the distance between layers 110 and 112 are such that space 114 is filled with the material of layer 116.

As a variation, layer 116 may comprise two different layers, a first layer covering layer 110 except for opening 118a, and a second layer covering layer 112 except for opening 118b. The first and second layers are, for example, separated at the level of space 114 between layers 110 and 112.

As a variation, emitter 100 and receiver 102 may be bonded to the support by other means, and coupled together and/or to other components, by other means. It will be within the abilities of those skilled in the art to implement such others means by maintaining layers 110 and 112 totally surrounded with a material opaque to the wavelengths of the rays capable of being emitted by the emitter, except for openings 118.

FIGS. 2 to 5 show steps, preferably successive, of an embodiment of a method of manufacturing the device of FIG. 1. FIGS. 2 to 5 describe the manufacturing of a single device 10. In practice, devices 10 are manufactured in wafers, that is, a plurality of devices 10 is simultaneously manufactured on a same wafer. The plurality of devices 10, for example, forms an array of devices. The devices 10 are, for example, separated from one another by a distance greater than or equal to approximately 250 µm. The steps described in relation with FIGS. 2 to 5 are simultaneously carried out in a plurality of locations in the wafer.

Figure 2:
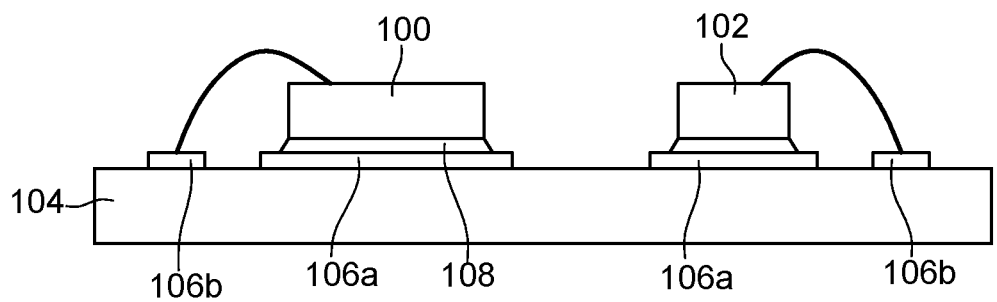
FIG. 2 shows a step of manufacturing the embodiment of FIG. 1.

FIG. 2 shows a step of manufacturing the embodiment of FIG. 1.

During this step, conductive pads 106 are formed on support 104. Similarly, the means for coupling the conductive pads, that is, vias and metallizations located in support 104 and/or conductive tracks located on support 104, are formed.

Emitter 100 and receiver 102, having been previously manufactured, are then bonded to pads 106a. For example, emitter 100 and receiver 102 are bonded to pads 106a by the bonding layers 108 deposited on pads 106a.

Connections may also be formed between emitter 100 and pads 106b, and between receiver 102 and pads 106b. Such connections are, for example, formed as previously described, for example, by electric (bonding) wires coupling emitter 100 or receiver 102 and pads 106b.

Figure 3:
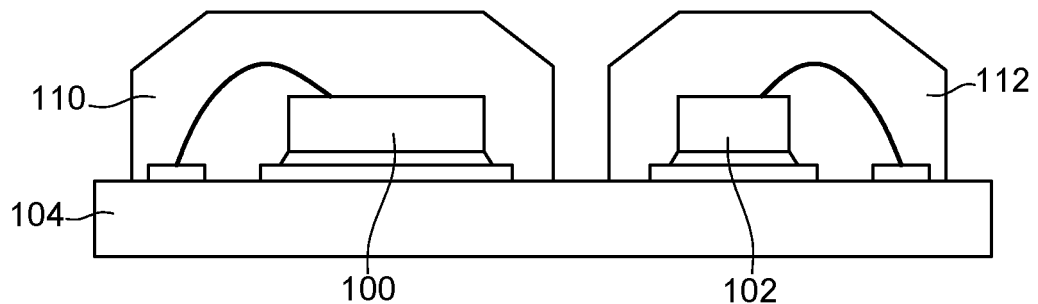
FIG. 3 shows another step of manufacturing the embodiment of FIG. 1.

FIG. 3 shows another step of manufacturing the embodiment of FIG. 1.

During this step, layers 110 and 112 are respectively formed on emitter 100 and on receiver 102.

Layers 110 and 112 are, for example, made of resin transparent to the wavelengths of the rays capable of being emitted by emitter 100.

Layers 110 and 112 are, for example, formed by forming a mold around the emitter and the receiver and by filling it with resin, to obtain the shape described in relation with FIG. 1.

Figure 4:
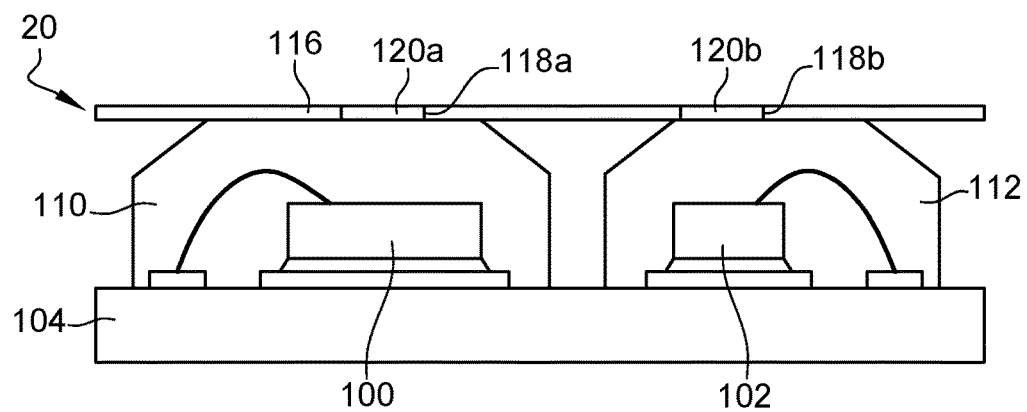
FIG. 4 shows another step of manufacturing the embodiment of FIG. 1.

FIG. 4 shows another step of manufacturing the embodiment of FIG. 1.

During this step, a layer 20, comprising layer 116 and filters 120, is formed on the structure resulting from the previous step.

Layer 116 is, as previously described, made of a material opaque at least to the wavelengths of the light rays capable of being emitted by emitter 100. Further, layer 116 is preferably made of a stretchable material. Preferably, what is referred to here as stretchable material is a material having a breaking strength greater than or equal to approximately 30 MPa, preferably greater than or equal to approximately 39 MPa and/or a material having an elongation at break in the range from approximately 150% to 550%, preferably from 200% to 510%.

Preferably, filters 120 are made of a non-stretchable material, that is, for example, materials having an elongation at break smaller than 200%, preferably smaller than 125%. For example, the filters are made of a material having the following transmittance values: smaller than approximately 10% for wavelengths shorter than approximately 650 nm, preferably for wavelengths shorter than 750 nm; and greater than approximately 90% for wavelengths greater than 900 nm, preferably for wavelengths greater than 850 nm.

Layer 116 comprises the previously-described openings 118. Filters 120 are located in openings 118, as previously described. Preferably, filters 120 are formed to be bonded in openings 118. For example, the lateral walls of filters 120 are bonded to the lateral walls of openings 118.

Filters 120 are preferably bonded in such a way that when layer 116 is stretched, filters 120 remain bonded to layer 116. Preferably, when layer 116 is stretched, no opening forms between a lateral wall of one of filters 120 and a lateral wall of the opening 118 where the filter is located.

For example, layer 20 is maintained substantially planar, preferably in a horizontal plane, that is, for example, a plane substantially parallel to the upper surface of support 104. Layer 20 is maintained above layers 110 and 112. More precisely, layer 20 is located at a level higher than the upper surface of layers 110 and 112. Layer 20 is, for example, maintained by holding posts, not shown, for example located on the wafer edges. The posts are, for example, bonded by one end to the upper surface of the support. Layer 20 is, for example, bonded to another end of each post, these other ends being at a distance from the upper surface of the support at least equal to, for example, greater than, the distance between the upper surface of layers 110 or 112 and the upper surface of support 104.

Preferably, layer 20 rests on the upper surfaces of layers 110 and 112. As a variation, layer 20 may be maintained separated from layers 110 and 112. Layer 20 is then not in contact with layers 110 and 112.

Layer 20 is, for example, maintained stretched. However, layer 20 is not fully stretched.

Layer 20 is placed in such a way that the filters are positioned at the location which is intended for them. Thus, layer 20 is positioned in such a way that the filters face receiver 102 and emitter 100, as described in relation with FIG. 1.

Figure 5:
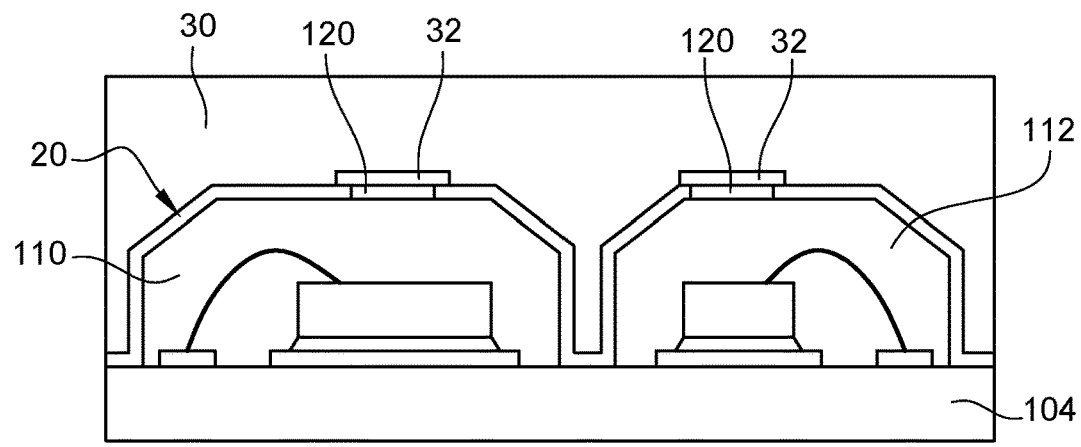
FIG. 5 shows another step of manufacturing the embodiment of FIG. 1.

FIG. 5 shows another step of manufacturing the embodiment of FIG. 1.

During this step, a mold 30 is pressed on the structure resulting from the previous step. Mold 30 is pressed from the upper surface side of support 104. Layer 20 is thus located between mold 30 and layers 110 and 112. Mold 30 comprises cavities having a shape complementary to that of layers 110 and 112 covered with layer 20.

The pressing of the mold 30 stretches layer 116 to extend it conformally on layers 110 and 112 and on the upper surface of support 104. More precisely, layer 116 then extends on the exposed portions of the upper surface of support 104 and on the lateral, inclined, and upper surfaces of layers 110 and 112.

Layer 116 is sufficiently stretchable to extend on layers 110 and 112 and on support 104 as previously described. Layer 116 is further sufficiently rigid to form a protection and not be damaged. Preferably, layer 116 has, after having been stretched, a thickness greater than or equal to approximately 100 μm.

Mold 30 is preferably made of a metal or of a material conducting heat. Thus, once layer 20 has been pressed against layers 110 and 112, the mold is heated to bond layer 116 to layers 110 and 112 and to support 104.

Preferably, mold 30 comprises secondary cavities 32. Secondary cavities 32 are located opposite filters 120. The dimensions of cavities 32 are such that the filters are not in contact with mold 30. The horizontal dimensions of cavities 32 are preferably at least equal to the horizontal dimensions of filters 120, preferably greater than the horizontal dimensions of filters 120. Preferably, the cavities entirely face the filters. The filters are thus totally covered with cavities 32. Preferably, cavities 32 do not totally cover the upper surfaces of layers 110 and 112. For example, cavities 32 are filled with air and the filters are entirely in contact with the air contained in cavities 32.

Preferably, the dimensions of the cavities are determined so that mold 30 applies a pressure on all the portions of layer 116 located on layers 110 and 112, except for the portions located opposite cavities 32.

Cavities 32 enable to avoid causing damage to the filters when layer 20 is pressed against layers 110 and 112. Further, cavities 32 enable to limit the motion of the filters when layer 116 is stretched.

According to an embodiment, the step of FIG. 5 further comprises an anneal step. During this step, the structure resulting from the step described in relation with FIG. 5 is placed in a furnace and heated. This step enables to improve the hold and the bonding of layer 116. The anneal step may be performed at another time of the method, subsequent to the step of FIG. 5. For example, the anneal step may be comprised within another step of another manufacturing method, for example, the manufacturing of another component of the wafer.

The shape of layers 110 or 112, and in particular the absence of sharp angles, that is, the absence of angles between the surfaces of layers 110 or 112, for example, greater than 70°, enables to avoid causing damage to layer 116. It could have been devised to form layers 110 and 112 having sharp angles, for example, having parallelepipedal shapes. The mold would then have a complementary shape, and during the pressing, layer 116 would then risk being damaged at the angles where adjacent surfaces join.

The manufacturing method of the embodiment of FIG. 1 comprises steps, not shown. In particular, the method comprises a step, subsequent to the steps described in relation with FIGS. 2 to 5, during which mold 30 is removed. The method further comprises a step during which the different devices 10 of a same wafer are individualized, that is, for example, support 104 is sawn between the different devices 10.

Figure 6:
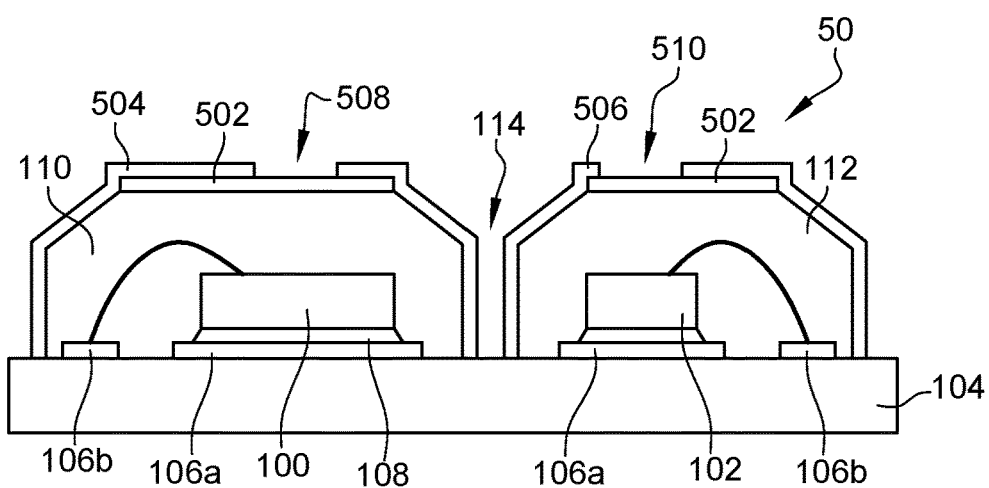
FIG. 6 shows another embodiment of an optoelectronic device.

FIG. 6 shows another embodiment of an optoelectronic device 50.

The embodiment of FIG. 6 comprises elements identical those of the device 10 of FIG. 1. These elements will not be detailed again. In particular, device 50 comprises, like device 10: support 104; emitter 100 and receiver 102; conductive pads 106, as well as the connection means to which they are coupled; bonding layers 108; and layers 110 and 112.

Device 50 further comprises filters 502. Filters 502 are identical to the filters 120 of device 10 except for their positioning. Filters 502 each at least partially cover the upper surface of layer 110 or of layer 112. Preferably, filters 502 substantially totally cover the upper surfaces of layers 110 or 112.

Device 50 comprises layers 504 and 506. Layers 504 and 506 are identical to layer 116, except that each layer 504 or 506 partially covers a single one of layers 110 or 112 and partially covers one of filters 502.

Layer 504 covers the lateral walls of layer 110, the inclined walls of layer 110, the lateral walls of one of filters 502, and a portion of the upper surface of filter 502. Possibly, layer 504 partially covers the upper surface of layer 110. Layer 504 comprises an opening 508 located like opening 118a of FIG. 1. Opening 508 thus faces emitter 100, so that the ray emitted by emitter 100 can cross opening 508. Preferably, openings 508 have the same dimensions as the filters 120 of FIG. 1.

Layer 506 covers the lateral walls of layer 112, the inclined walls of layer 112, the lateral walls of the other filter 502, and a portion of the upper surface of the other filter 502. Possibly, layer 506 partially covers the upper surface of layer 112. Layer 506 comprises an opening 510 located like opening 118b of FIG. 1. Opening 510 thus faces receiver 102, so that the ray received by receiver 102 can cross opening 510.

In the example of FIG. 6, layers 504 and 506 are distinct. Layers 504 and 506 are thus not in contact. Layers 504 and 506 are separated, for example, in the space 114 separating layers 110 and 112. As a variation, layers 504 and 506 may form a single layer extending on the upper surface of support 104 in space 114, like layer 116 of FIG. 1.

Figure 7:
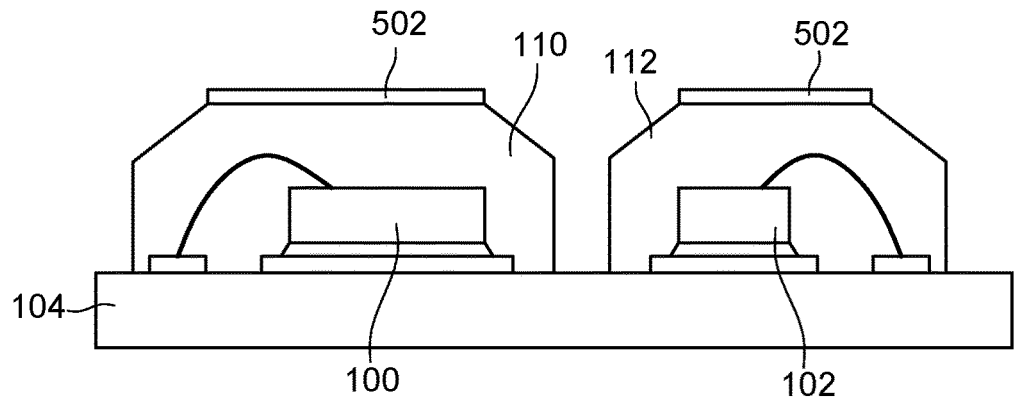
FIG. 7 shows a step of manufacturing the embodiment of FIG. 6.
Figure 8:
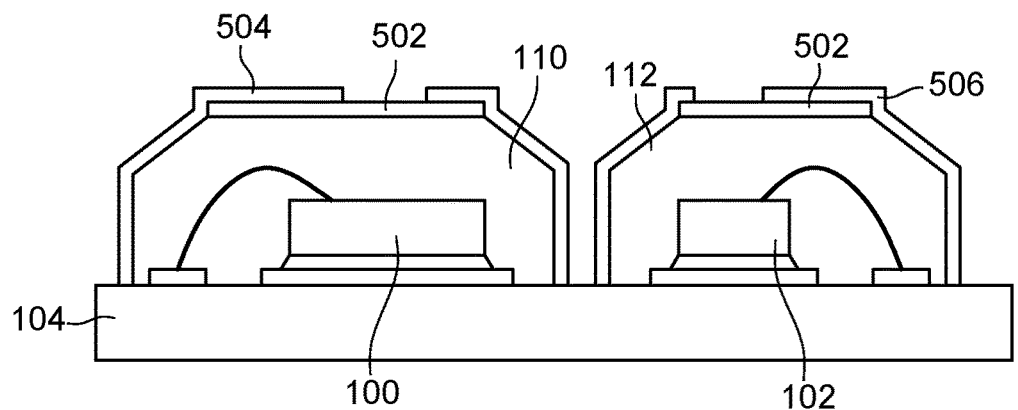
FIG. 8 shows another step of manufacturing the embodiment of FIG. 6.

FIGS. 7 and 8 show steps, preferably successive, of a method of manufacturing the embodiment of FIG. 6. The manufacturing method comprises, before the steps of FIGS. 7 and 8, the steps described in relation with FIGS. 2 and 3.

Like FIGS. 2 to 5, FIGS. 7 and 8 describe the manufacturing of a single device 50. In practice, devices 50 are manufactured in wafers, that is, a plurality of devices 50 is simultaneously manufactured on a same wafer. The plurality of devices 50, for example, forms an array of devices. The steps described in relation with FIGS. 7 and 8 are carried out simultaneously in a plurality of locations in the wafer.

FIG. 7 shows a step of manufacturing the embodiment of FIG. 6.

During this step, filters 502 are formed on the upper surfaces of layers 110 and 112.

The filters are, for example, formed by a spin coating method. As a variation, filters 502 are, for example, formed by a sputtering method.

The forming of filters 502 is, for example, preceded by a step of forming a mask, not shown, protecting the portions on which the filters should not be formed, for example, the upper surface of support 104, as well as the lateral inclined walls of layers 110 and 112.

Filters 502, for example, have the same thickness as the filters 120 of FIG. 1. Filters 502 have dimensions at least equal to the dimensions of the filters 120 of FIG. 1 and cover at least the portion of layers 110 and 112 covered with filters 120.

FIG. 8 shows another step of manufacturing the embodiment of FIG. 6.

During this step, layers 504 and 506 are formed. For example, this step includes the forming of a mask, not shown, covering the locations on which layers 504 and 506 do not extend. In particular, the mask covers a portion of each filter 502 located opposite receiver 102 and emitter 100. The mask preferably covers the upper surface of support 104. The lateral and inclined surfaces of layers 110 and 112 are not covered with the mask.

Layers 504 and 506 are then formed, for example by a sputtering method, at the locations which are not protected by the mask.

Layers 110 and 112 are thus entirely covered with layers 504 and 506, except for the openings located opposite receiver 102 and emitter 100.

The manufacturing method of the embodiment of FIG. 6 may thus comprise two sputtering steps and two mask-forming steps.

The manufacturing method of FIG. 6 comprises manufacturing steps, not shown. In particular, the method comprises, like the method described in relation with FIGS. 2 to 5, individualizing the different devices 50.

Figure 9:
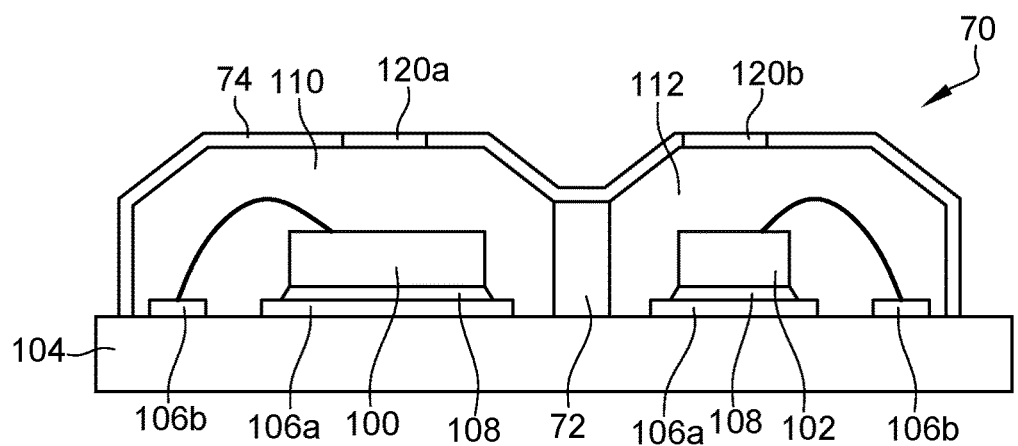
FIG. 9 shows another embodiment of an optoelectronic device.

FIG. 9 shows another embodiment of an optoelectronic device 70.

The embodiment of FIG. 9 comprises elements identical to the embodiment of FIG. 1. These elements will not be detailed again. In particular, device 70 comprises, like device 10: support 104; emitter 100 and receiver 102; conductive pads 106, as well as the connection means to which they are coupled; bonding layers 108; and layers 110 and 112.

Conversely to the embodiment of FIG. 1, the layers 110 and 112 of device 70 are not separated by a space 114, but by a region 72. Region 72 is made of a material opaque to the wavelengths of the rays capable of being emitted by emitter 100. Region 72 preferably fills the entire space separating layers 110 and 112. Region 72 is thus preferably in contact with the lateral surfaces of layers 110 and 112. Region 72 preferably extends from the upper surface of support 104 and, for example, all the way to the angle between the lateral surfaces and the inclined surfaces.

Device 70 further comprises a layer 74 identical to layer 116, but which does not extend in the space between layers 110 and 112. Layer 74 extends on region 72 and on the lateral, inclined and upper walls of layers 110 and 112, except for the locations of the upper surface of layers 110 and 112 having filters 120 located thereon.

Layers 110 and 112 are thus entirely covered with materials opaque to the wavelengths of the rays emitted by emitter 100, except for the openings facing emitter 100 and receiver 102.

As a variation, region 72 may extend along another height than that shown. Preferably, region 72 extends at least along the maximum height between the height of the emitter and the height of the receiver. For example, region 72 extends all the way to the upper surface of layers 110 and 112, and thus covers the inclined surfaces located between layers 110 and 112.

Figure 10:
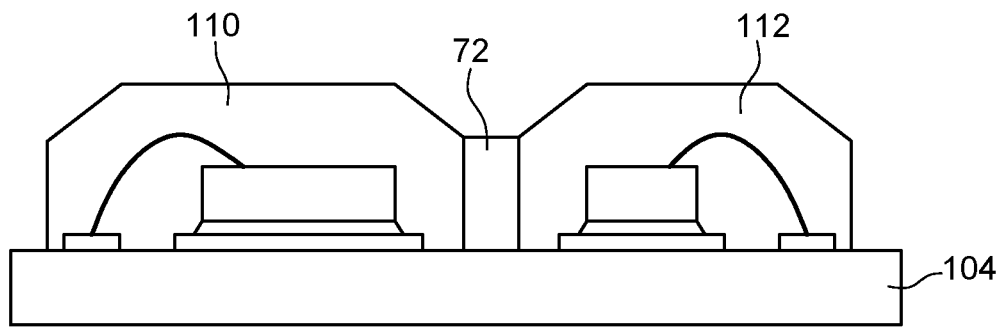
FIG. 10 shows a step of manufacturing the embodiment of FIG. 9.
Figure 11:
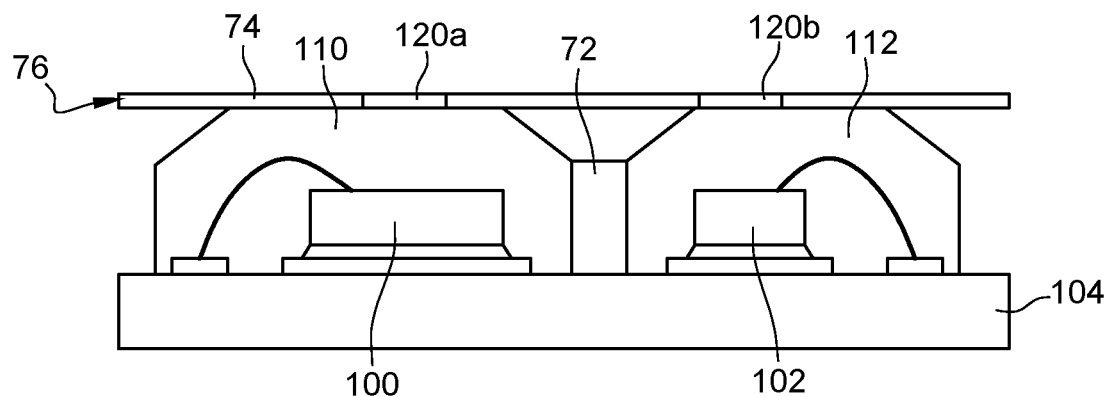
FIG. 11 shows another step of manufacturing the embodiment of FIG. 9.
Figure 12:
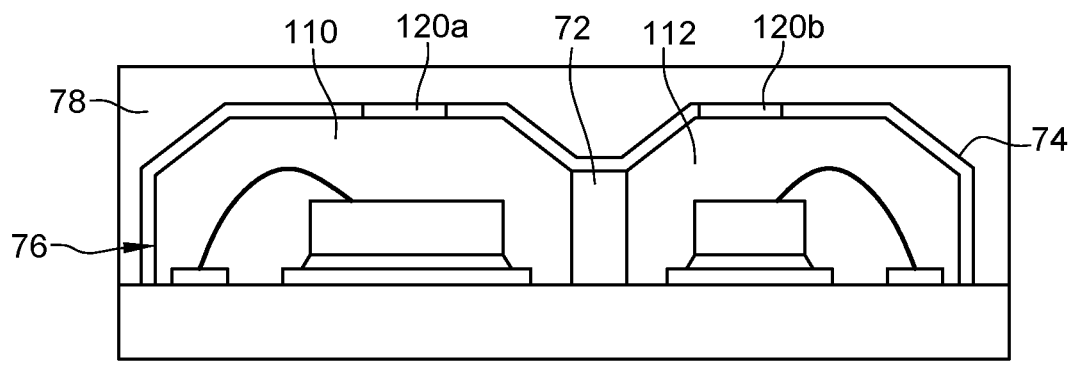
FIG. 12 shows another step of manufacturing the embodiment of FIG. 9.

FIGS. 10 to 12 show steps, preferably successive, of a method of manufacturing the embodiment of FIG. 9. The manufacturing method comprises, before the steps of FIGS. 10 to 12, the steps described in relation with FIGS. 2 and 3.

Like FIGS. 2 to 5, FIGS. 10 to 12 describe the manufacturing of a single device. In practice, devices 70 are manufactured in wafers, that is, a plurality of devices 70 is simultaneously manufactured on a same wafer. The plurality of devices 70, for example, forms an array of devices. Thus, the steps described in relation with FIGS. 10 to 12 are carried out simultaneously in a plurality of locations of the wafer.

FIG. 10 shows a step of manufacturing the embodiment of FIG. 9.

During this step, region 72 is formed in the space between layers 110 and 112. Region 72 is, for example, formed by sputtering, or by any other method enabling to form region 72 of material between layers 110 and 112. The space between layers 110 and 112 is totally filled with the material of region 72.

FIG. 11 shows another step of manufacturing the embodiment of FIG. 9.

This step is identical to the step described in relation with FIG. 4. A layer 76, comprising layer 74 and filters 120, is located above layers 110 and 112. Layer 74 is identical, for example, to the layer 116 of FIG. 4.

FIG. 12 shows another step of manufacturing the embodiment of FIG. 9.

This step is identical to the step of FIG. 5, except that the mold has a different shape. Indeed, the mold, here bearing reference numeral 78, has a shape complementary to the shape of layers 110 and 112, of region 72, and of the layer 76 pressed against them.

The manufacturing method of the embodiment of FIG. 9 comprises steps, not shown. In particular, the method comprises a step, subsequent to the steps described in relation with FIGS. 10 to 12, during which mold 78 is removed. The method further comprises a step during which the different devices 70 of a same wafer are individualized, that is, for example, support 104 is sawn between the different devices 70.

An advantage of the described embodiments is that the ray emitted by emitter 100 cannot directly reach receiver 102. Indeed, the receiver and the emitter are separated by a portion of an opaque material (region 72 or layer 116, 504, 506). The measurement of the received ray is thus not disturbed, which enables to better measure the distance.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A manufacturing method, comprising:
   mounting an emitter of light rays on a support;
   mounting a receiver of light rays on the support;
   forming a first encapsulating layer on the support which encapsulates the emitter and a second encapsulating layer on the support which encapsulates the receiver, wherein the first and second encapsulating layers are separated from each other by an opening;
   wherein the first and second encapsulating layers are at least partially transparent to the wavelengths of the light rays emitted by the emitter; and forming a layer covering the first and second encapsulating layers, wherein forming the layer comprises:
placing the layer in a position substantially planar above the first and second encapsulating layers; and
pressing a mold on the layer so that the layer is deformed by said mold to conformally cover the first and second encapsulating layers and line said opening which separates the first and second encapsulating layers;
wherein said layer covering the first and second encapsulating layers is made of a material that is opaque to the wavelengths of the light rays emitted by the emitter.

2. The method according to claim 1, wherein the layer is made of a stretchable material.

3. The method according to claim 1, wherein forming the first and second encapsulating layers comprises molding to form each of the first and second encapsulating layers to have a shape of a tapered parallelepiped, said tapered parallelepiped having a substantially horizontal upper surface, substantially vertical lateral surfaces and inclined surfaces joining the lateral surfaces and the upper surface.

4. The method according to claim 3, wherein placing the layer comprises placing the layer in said position substantially planar on the substantially horizontal upper surfaces of the tapered parallelepipeds for the first and second encapsulating layers.

5. The method according to claim 4, wherein pressing comprises pressing a mold on the layer so that the layer is deformed by said mold to conformally cover the substantially vertical lateral surfaces and inclined surfaces of the tapered parallelepipeds for the first and second encapsulating layers.

6. The method according to claim 1, further comprising forming a first opening in said layer at a location facing the receiver and forming a second opening in said layer at a location facing wherein the emitter.

7. The method according to claim 6, further comprising providing a filter located in each of the first and second openings.

8. The method according to claim 6, wherein forming the first and second openings in said layer exposes filters located between the layer and said first and second encapsulating layers.

9. An optoelectronic device as formed by the method of claim 1.

10. A manufacturing method, comprising:
mounting an emitter of light rays on a support;
mounting a receiver of light rays on the support;
forming a first encapsulating layer on the support which encapsulates the emitter and a second encapsulating layer on the support which encapsulates the receiver, wherein the first and second encapsulating layers are separated from each other by an opening;
wherein the first and second encapsulating layers are at least partially transparent to the wavelengths of the light rays emitted by the emitter;
placing an opaque block in said opening between the first and second encapsulating layers; and
forming a layer covering the first and second encapsulating layers and said opaque block, wherein forming the layer comprises:
placing the layer in a position substantially planar above the first and second encapsulating layers; and
pressing a mold on the layer so that the layer is deformed by said mold to conformally cover the first and second encapsulating layers and a top surface of said opaque block which separates the first and second encapsulating layers;
wherein said layer covering the first and second encapsulating layers is made of a material that is opaque to the wavelengths of the light rays emitted by the emitter.

11. The method according to claim 10, wherein the layer is made of a stretchable material.

12. The method according to claim 10, wherein forming the first and second encapsulating layers comprises molding to form each of the first and second encapsulating layers to have a shape of a tapered parallelepiped, said tapered parallelepiped having a substantially horizontal upper surface, substantially vertical lateral surfaces and inclined surfaces joining the lateral surfaces and the upper surface.

13. The method according to claim 12, wherein placing an opaque block comprises positioning the opaque block against the substantially vertical lateral surfaces of the tapered parallelepipeds for the first and second encapsulating layers.

14. The method according to claim 13, wherein placing the layer comprises placing the layer in said position substantially planar on the substantially horizontal upper surfaces of the tapered parallelepipeds for the first and second encapsulating layers.

15. The method according to claim 14, wherein pressing comprises pressing a mold on the layer so that the layer is deformed by said mold to conformally cover the inclined surfaces of the tapered parallelepipeds for the first and second encapsulating layers and the top surface of said opaque block.

16. The method according to claim 10, further comprising forming a first opening in said layer at a location facing the receiver and forming a second opening in said layer at a location facing wherein the emitter.

17. The method according to claim 16, further comprising providing a filter located in each of the first and second openings.

18. The method according to claim 16, wherein forming the first and second openings in said layer exposes filters located between the layer and said first and second encapsulating layers.

19. An optoelectronic device as formed by the method of claim 10.

20. A manufacturing method, comprising:
mounting an emitter of light rays on a support;
mounting a receiver of light rays on the support;
forming a first encapsulating layer on the support which encapsulates the emitter and a second encapsulating layer on the support which encapsulates the receiver, wherein the first and second encapsulating layers are separated from each other by an opening;
wherein the first and second encapsulating layers are at least partially transparent to the wavelengths of the light rays emitted by the emitter; and
forming a layer covering the first and second encapsulating layers, wherein forming the layer comprises sputtering a material that is opaque to the wavelengths of the light rays emitted by the emitter on the first and second encapsulating layers.

21. The method according to claim 20, wherein sputtering comprises sputtering the material into the opening which separates the first and second encapsulating layers.

22. The method according to claim 20, further comprising:
placing an opaque block in said opening between the first and second encapsulating layers; and wherein sputtering comprises sputtering the material into a top surface of the opaque block.

23. The method according to claim 20, wherein forming the first and second encapsulating layers comprises molding to form each of the first and second encapsulating layers to have a shape of a tapered parallelepiped, said tapered parallelepiped having a substantially horizontal upper surface, substantially vertical lateral surfaces and inclined surfaces joining the lateral surfaces and the upper surface.

24. The method according to claim 20, further comprising forming a first opening in said layer at a location facing the receiver and forming a second opening in said layer at a location facing wherein the emitter.

25. The method according to claim 24, further comprising providing a filter located in each of the first and second openings.

26. The method according to claim 25, wherein forming the first and second openings in said layer exposes filters located between the layer and said first and second encapsulating layers.

27. An optoelectronic device as formed by the method of claim 20.

* * * * *